United States Patent
Zhong et al.

(10) Patent No.: US 6,784,532 B2
(45) Date of Patent: Aug. 31, 2004

(54) POWER/GROUND CONFIGURATION FOR LOW IMPEDANCE INTEGRATED CIRCUIT

(75) Inventors: Dong Zhong, Chandler, AZ (US); Farzaneh Yahyaei-Moayyed, Chandler, AZ (US); David G. Figueroa, Mesa, AZ (US); Chris Baldwin, Chandler, AZ (US); Jiangqi He, Chandler, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 10/209,847

(22) Filed: Jul. 31, 2002

(65) Prior Publication Data

US 2004/0021215 A1 Feb. 5, 2004

(51) Int. Cl.⁷ .............................................. H01L 23/52
(52) U.S. Cl. ...................... 257/691; 257/668; 257/692
(58) Field of Search ............................. 257/691, 668, 257/692

(56) References Cited

U.S. PATENT DOCUMENTS

| 6,274,925 B1 | | 8/2001 | Fazelpour ................... 257/678 |
| 6,326,678 B1 | * | 12/2001 | Karnezos et al. ........... 257/666 |
| 6,424,032 B1 | * | 7/2002 | Ikemoto et al. ............. 257/691 |

* cited by examiner

*Primary Examiner*—Luan Thai
(74) *Attorney, Agent, or Firm*—Schwegman, Lundberg, Woessner & Kluth, P.A.

(57) ABSTRACT

An integrated circuit including a die, a power terminal and a ground terminal all mounted onto a substrate. The power terminal including a body and a first extension projecting from the body, and the ground terminal including a body and a second extension projecting from the body. The second extension on the ground terminal being adjacent to the first extension on the power terminal to offset inductance that is generated by supplying current to the die through the power terminal.

20 Claims, 3 Drawing Sheets

POWER/GROUND CONFIGURATION FOR LOW IMPEDANCE INTEGRATED CIRCUIT

TECHNICAL FIELD

An integrated circuit that includes a low impedance current path to supply power to a die, and more particularly, to an integrated circuit with an interlocking power/ground configuration.

BACKGROUND

The current paths in integrated circuits must be able to handle ever-increasing current levels which are being used to power such devices as processors and application-specific integrated circuits (ASICs). Processors need more power in order to operate at multiple-gigahertz frequencies and to simultaneously perform numerous logic and memory operations. Resistance along the current paths at higher current levels often generates enough heat to damage the processor.

Higher currents also generate more inductance along the current paths to the processor. The higher inductance can increase the impedance in the current paths until the high impedance degrades signals that are sent to the processor.

Current is typically supplied to a processor through a plurality of pins. One way to deal with the concerns created by supplying high currents is to add more pins, because a greater number of pins will have a larger cumulative cross-sectional area resulting in a lower resistance.

The drawbacks with adding pins include increased cost and the use of precious space on the integrated circuit. In addition, when pins are added they may not have a significantly lowered resistance as compared to the resistance of the pins in the more active regions of the processor. Therefore, the additional pins may not be effective in reducing current through certain regions of the integrated circuit.

There is a need for an integrated circuit that includes a low impedance current path that is parallel to existing pins such that some current is delivered through the low impedance parallel path instead of through the pins. Reducing the amount of current through the pins decreases the heat that is generated by the pins during operation of the die.

DETAILED DESCRIPTION

The following detailed description references the accompanying drawings. Like numerals describe substantially similar components throughout each of the drawings. Other embodiments may be used, and structural, logical, and electrical changes made. The integrated circuit described herein can be manufactured, used, or shipped in a number of positions and orientations.

The integrated circuit includes a die (e.g., a processor) and a low impedance current path for providing power to the processor. The integrated circuit includes power and ground terminals with relatively large cross-sectional areas to provide a low resistance path for DC current. The configuration of the power and ground terminals increases the coupling between power and ground currents to reduce the inductance associated with supplying AC current to the processor through the power terminal. When power and ground terminals are used in combination with pins, they form a parallel low impedance power delivery path that reduces the current flow through the higher resistance pins.

Figure 1:
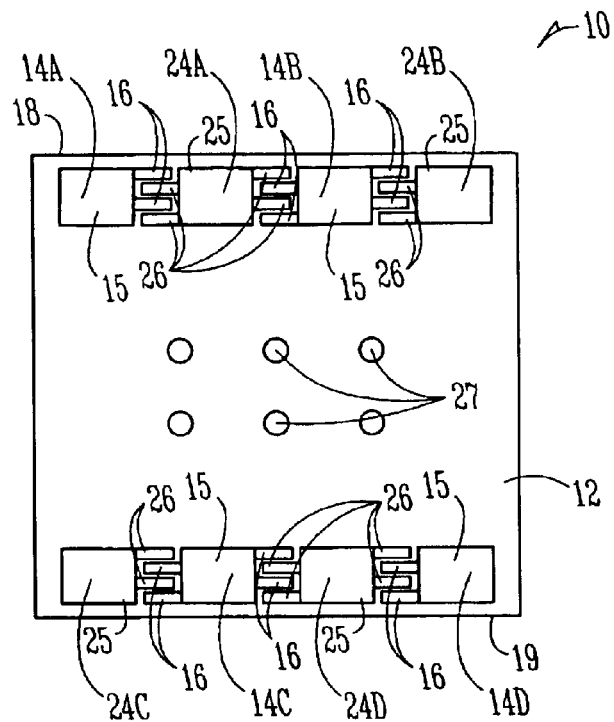
FIG. 1 is a bottom view of an integrated circuit that includes an interlocking power/ground configuration.
Figure 2:
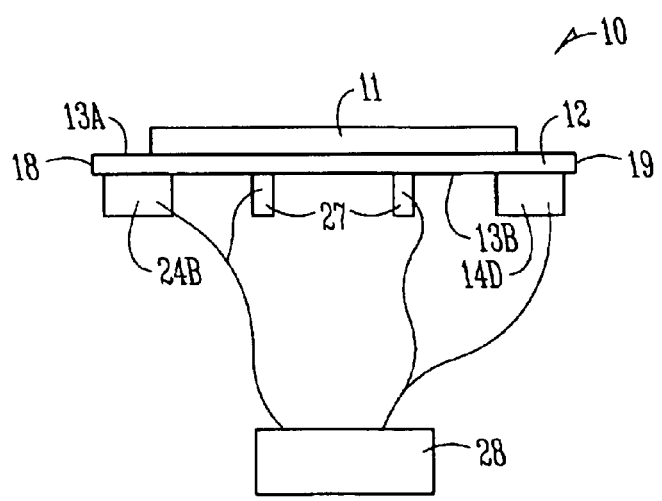
FIG. 2 is a side view of the integrated circuit depicted in FIG. 1.

FIGS. 1 and 2 illustrate an integrated circuit 10 that includes a die 11 mounted onto a substrate 12. Integrated circuit 10 further includes a first power terminal 14A and a first ground terminal 24A that are disposed on a side of substrate 12 that is opposite to die 11. First ground terminal 24A is between first power terminal 14A and a second power terminal 14B. Second power terminal 14B is between first ground terminal 24A and a second ground terminal 24B. First and second power terminals 14A, 14B and first and second ground terminals 24A, 24B are positioned along an edge 18 of substrate 12.

Integrated circuit 10 further includes a third ground terminal 24C that is spaced apart from a third power terminal 14C. Third power terminal 14C is between third ground terminal 24C and a fourth ground terminal 24D. Fourth ground terminal 24D is between third power terminal 14C and a fourth power terminal 14D. Third and fourth power terminals 14C, 14D and third and fourth ground terminals 24C, 24D are positioned along an opposing edge 19 of substrate 12. Each power terminal 14A–D and each ground terminal 24A–D are on one side 13A of substrate 12, and die 11 is disposed on an opposite side 13B of substrate 12.

In other embodiments, the power and ground terminals can (i) extend along only one edge on substrate 12; (ii) extend along each edge of substrate 12; and (iii) be positioned away from any edge on substrate 12. In addition, the number of power and ground terminals may vary as long as there is at least one power terminal and one ground terminal.

Each power terminal 14A–D includes a body 15 and extensions 16 that project from the body 15. Each ground terminal 24A–D includes a body 25 and extensions 26 that project from the body 25. The extensions 16 on each power terminal 14A–D are adjacent to at least one extension 26 on at least one of the ground terminals 24A–D. In addition, the extensions 26 on each ground terminal 24A–D are adjacent to at least one extension 16 on at least one of the power terminals 14A–D. In one example embodiment, each extension 16 on power terminals 14A–D is adjacent to at least one body 25 on one of the ground terminals 24A–D, and each extension 26 on ground terminals 24A–D is adjacent to at least one body 15 on one of the power terminals 14A–D.

It should be noted that in other embodiments, the arrangement and number of extensions on the power and ground terminal may vary. However, in configurations where there is more intermingling between adjacent power and ground terminals, the inductances that are generated by passing current through power terminals and ground terminals in opposite directions tend to cancel each other out. Since the design of the terminal tends to cancel out the inductance in each of the terminals, the terminals with intermingling extensions form a current path having lower impedance.

Figure 3:
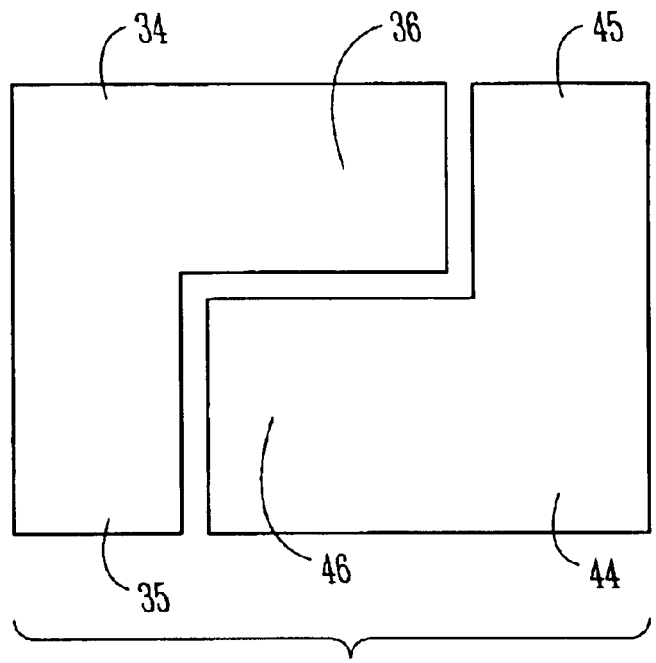
FIG. 3 is a bottom view illustrating another form of power and ground terminals that are incorporated into an integrated circuit.

FIG. 3 illustrates an example configuration for adjacent power and ground terminals that includes a different number of extensions. A power terminal 34 is adjacent to a ground terminal 44. The power terminal 34 includes a body 35 and an extension 36 that projects from the body 35. The ground terminal 44 includes a body 45 and an extension 46 that projects from the body 45. The extension 36 on power terminal 34 is adjacent to extension 46 on ground terminal 44. In an example embodiment, extension 36 on power terminal 34 is in close proximity to body 45 on ground terminal 46, and extension 46 on ground terminals 44 is in close proximity to body 35 on power terminal 34.

Figure 4:
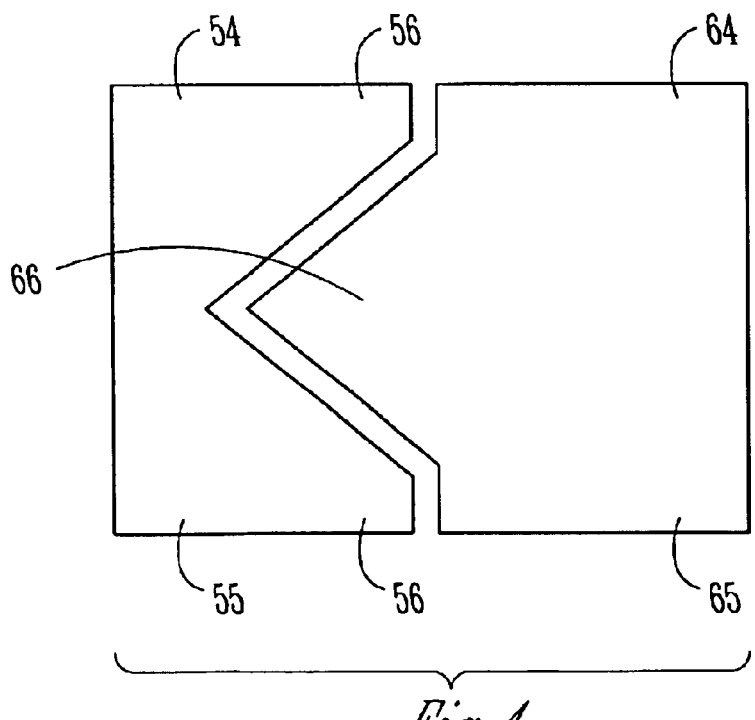
FIG. 4 is a bottom view similar to FIG. 3 illustrating another form of power and ground terminals.

FIG. 4 illustrates another example configuration for adjacent power and ground terminals. The power and ground terminals include extensions having different geometries. A power terminal 54 is adjacent to a ground terminal 64. The power terminal 54 includes a body 55 and two extensions 56 that project from body 55. The ground terminal 64 includes a body 65 and an extension 66 that projects from the body 65. Extension 66 on ground terminal 64 projects between extensions 56 on power terminal 54.

FIGS. 1–4 illustrate that in some embodiments, the power and ground terminals are interlocking. As used herein, interlocking means that the power terminals include a body and an extension projecting from the body and the ground terminal terminals include a body and an extension projecting from the body such that the extensions on the ground terminals are adjacent to the extensions on the power terminals.

Referring again to FIGS. 1 and 2, integrated circuit 10 may include one or more pins 27 that can supply I/O signals to die 11. In alternative embodiment, a voltage source 28 (see FIG. 2) is connected to some, or all, of the pins 27 to supply power to die 11. Pins 27 are optimally located directly below die 11 to minimize the distance between pins 27 and die 11. Voltage source 28 may also be connected to power terminals 14A–D and ground terminals 24A–D. Depending on the number of pins 27, the power terminals 14A–D and ground terminals 24A–D have a much larger cumulative cross-sectional area than pins 27. The larger cross-sectional area of power terminals 14A–D and ground terminals 24A–D provides a lower resistance current path to die 11 as compared to pins 27, especially for DC current. In an example embodiment, the cross-sectional area of the power and ground terminals is much larger than the cross-sectional area of the pins 27.

The intermingling of the power and ground terminals lowers the inductance within the terminals making the current path that includes the terminals more receptive to AC current. The relatively low resistance and inductance of the current path through the power and ground terminals forms a low impedance parallel path for power delivery to die 11. During operation of integrated circuit 10, most of the current is supplied through the low impedance path provided by power and ground terminal 14A–D, 24A–D.

A die is typically made of semiconductive material that has been separated from a wafer after integrated processing. Wafers may be made of semiconducting, non-semiconducting, or combinations of semiconducting and non-semiconducting materials.

Integrated circuit 10 can be adapted for use with any conventional socket to connect integrated circuit 10 to another substrate or some other electronic device, such as a motherboard. In some embodiments, the socket includes power and ground terminals that are similar in design to the power and ground terminals on integrated circuit 10 in order to obtain similar low impedance benefits. The socket is selected by determining the appropriate components based on the space available and the particular electrical situation.

Figure 5:
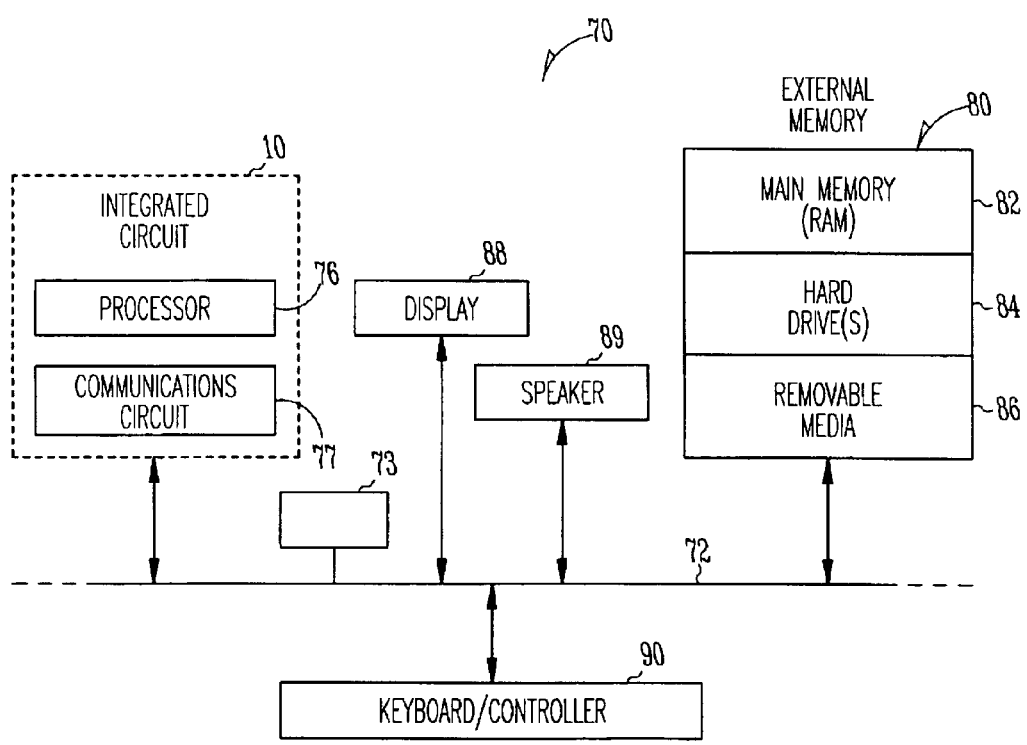
FIG. 5 is a block diagram of an electronic system incorporating at least one integrated circuit that includes an interlocking power/ground configuration.

FIG. 5 is a block diagram of an electronic system 70 incorporating at least one electronic assembly, such as integrated circuit 10 illustrated in FIGS. 1 and 2. Electronic system 70 may be a computer system that includes a system bus 72 to electrically couple the various components of electronic system 70. System bus 72 may be a single bus or any combination of busses. Electronic system 70 may include a voltage source 73 that provides power to integrated circuit 10. In some embodiments, voltage source 73 supplies current to integrated circuit 10 through buss 72.

Integrated circuit 10 is electrically coupled to system bus 72 and may include any circuit, or combination of circuits. In one embodiment, integrated circuit 10 includes a processor 76 which can be of any type. As used herein, processor means any type of circuit such as, but not limited to, a microprocessor, a microcontroller, a graphics processor or a digital signal processor.

Other types of circuits that can be included in integrated circuit 10 are a custom circuit or an application-specific integrated circuit, such as communications circuit 77 for use in wireless devices such as cellular telephones, pagers, portable computers, two-way radios, and similar electronic systems.

Electronic system 70 may also include an external memory 80 that in turn may include one or more memory elements suitable to the particular application, such as a main memory 82 in the form of random access memory (RAM), one or more hard drives 84, and/or one or more drives that handle removable media 86, such as diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

As shown herein, integrated circuit 10 can be implemented in a number of different embodiments, including an electronic package, an electronic system, a computer system, one or more methods of fabricating an integrated circuit, and one or more methods of fabricating an electronic assembly that includes the integrated circuit. The elements, materials, geometries, dimensions, and sequence of operations can all be varied to suit particular packaging requirements.

FIGS. 1–5 are merely representational and are not drawn to scale. Certain proportions thereof may be exaggerated, especially as to the power and ground terminals, while others may be minimized.

The integrated circuit described above provides a solution for integrated circuits that are powered by high currents. The interlocking power/ground configuration gives designers a multitude of options for developing integrated circuits that include a high-powered processor. Many other embodiments will be apparent to those of skill in the art from the above description.

What is claimed:

1. An integrated circuit comprising:
    a substrate;
    a die mounted on the substrate;
    a first power terminal mounted on the substrate and electrically connected to the die, the first power terminal including a body and a first extension projecting from the body; and
    a first ground terminal mounted on the substrate and electrically connected to the die, the first ground terminal including a body and a second extension projecting from the body, the second extension on the first ground terminal being adjacent to the first extension on the first power terminal, the first power terminal and the first ground terminal being disposed on one side of the substrate and the die being disposed on an opposite side of the substrate.

2. The integrated circuit of claim 1 further comprising at least one input/output (I/O) pin electrically connected to the die and mounted to the substrate on the same side of the substrate as the first power terminal and the first ground terminal.

3. The integrate circuit claim 2, wherein the first power terminal includes a first cross-sectional area and the at least one input/output (I/O) pin includes a second cross-sectional area that is smaller than the first cross-sectional area.

4. The integrated circuit of claim 1 further comprising a second power terminal that includes a body and a third extension projecting from the body, the third extension on the second power terminal being adjacent to a fourth extension that projects from the body of the first ground terminal.

5. The integrated circuit of claim 1 further comprising a second ground terminal that includes a body and a fifth extension projecting from the body, the fifth extension on the second ground terminal being adjacent to a sixth extension that projects from the body of the second power terminal.

6. The integrated circuit of claim 1, wherein the first extension on the first power terminal is adjacent to the body of the first ground terminal.

7. The integrated circuit of claim 6, wherein the second extension on the first ground terminal is adjacent to the body of the first power terminal.

8. The integrated circuit of claim 1, further comprising a second power terminal and a second ground terminal, the second power terminal positioned between the first and second ground terminals and the first ground terminal positioned between the first and second power terminals.

9. The integrated circuit of claim 8, wherein the first and second power terminals and the first and second ground terminals are along one edge of the substrate.

10. The integrated circuit of claim 9, further comprising third and fourth power terminals and third and fourth ground terminals positioned along an opposing edge of the substrate, the third power terminal positioned between the third and fourth ground terminals and the fourth ground terminal positioned between the third and fourth power terminals.

11. An integrated circuit comprising:
a substrate;
a die mounted on the substrate;
a first power terminal mounted on the substrate and electrically connected to the die, the first power terminal including a body and a first extension projecting from the body;
a first ground terminal mounted on the substrate and electrically connected to the die, the first ground terminal including a body that is adjacent to the first extension and second and third extensions extension projecting from the body, the second extension being adjacent to the first extension and the body of first power terminal;
a second power terminal including a body and fourth and fifth extensions extension projecting from the body, the fourth extension being adjacent to the third extension and the body of the first ground terminal, the first ground terminal positioned between the first and second power terminals;
a second ground terminal including a sixth extension, the sixth extension being adjacent the fifth extension and the body of the second power terminal, the second power terminal positioned between the first and second ground terminals.

12. The integrated circuit of claim 11, wherein the first and second power terminals and the first and second ground terminals are on one side of the substrate and the die is disposed on an opposite side of the substrate.

13. The integrated circuit of claim 11, wherein the first power terminal includes an additional extension that is adjacent to the second extension and the body of the first ground terminal.

14. The integrated circuit of claim 13, wherein the first ground terminal includes one additional extension that is adjacent to the first extension and the body of first power terminal and another additional extension that is adjacent to the fourth extension and the body of second power terminal.

15. The integrated circuit of claim 14, wherein the second power terminal includes one additional extension that is adjacent to the third extension and the body of the first ground terminal and another additional extension that is adjacent to the sixth extension and the body of the second ground terminal.

16. The integrated circuit of claim 15, wherein the second ground terminal includes an additional extension that is adjacent to the fifth extension and the body of the second power terminal.

17. The integrated circuit of claim 11 further comprising at least one input/output (I/O) pin electrically connected to the die and mounted to the substrate on the same side of the substrate as the first and second power terminals and the first and second ground terminals.

18. The integrated circuit of claim 11, wherein the first and second power terminals and the first and second ground terminals are along one edge of the substrate.

19. The integrated circuit of claim 18, further comprising third and fourth power terminals and third and fourth ground terminals positioned along an opposing edge of the substrate, the third power terminal positioned between the third and fourth ground terminals and the fourth ground terminal positioned between the third and fourth power terminals.

20. The integrated circuit of claim 19 further comprising at least one input/output (I/O) pin electrically connected to the die and mounted to the substrate on the same side of the substrate as the power terminals and the ground terminals, the at least one input/output (I/O) pin being between the first and second power and ground terminals and the third and fourth power and ground terminals.

* * * * *